US009258878B2

(12) United States Patent
Kim et al.

(10) Patent No.: US 9,258,878 B2
(45) Date of Patent: Feb. 9, 2016

(54) ISOLATION OF THERMAL GROUND FOR MULTIPLE HEAT-GENERATING DEVICES ON A SUBSTRATE

(71) Applicants: Gerald Ho Kim, Carlsbad, CA (US); Jay Eunjae Kim, Issaquah, WA (US)

(72) Inventors: Gerald Ho Kim, Carlsbad, CA (US); Jay Eunjae Kim, Issaquah, WA (US)

(*) Notice: Subject to any disclaimer, the term of this patent is extended or adjusted under 35 U.S.C. 154(b) by 239 days.

(21) Appl. No.: 13/928,380

(22) Filed: Jun. 27, 2013

(65) Prior Publication Data

US 2014/0226283 A1 Aug. 14, 2014

Related U.S. Application Data

(60) Provisional application No. 61/764,531, filed on Feb. 13, 2013.

(51) Int. Cl.
*H05K 7/20* (2006.01)
*H05K 1/02* (2006.01)
*H01L 23/473* (2006.01)

(52) U.S. Cl.
CPC ............ *H05K 1/0201* (2013.01); *H05K 1/0206* (2013.01); *H05K 1/0207* (2013.01); *H05K 2201/062* (2013.01); *H05K 2201/066* (2013.01); *H05K 2201/09663* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ........................ 361/676–678, 679.46–679.54, 361/688–723; 165/80.1–80.5, 104.33, 185; 174/15.1–15.3, 16.1–16.3, 547, 548; 257/712–722, E23.088; 24/453, 24/458–459
See application file for complete search history.

(56) References Cited

U.S. PATENT DOCUMENTS

| | | | | |
|---|---|---|---|---|
| 5,485,037 A * | 1/1996 | Marrs | ................... | H01L 21/565 257/659 |
| 6,243,269 B1 * | 6/2001 | Dibene, II | ............ | H05K 1/0207 174/15.2 |
| 6,297,079 B1 * | 10/2001 | Changey | ............... | H01L 23/473 257/707 |
| 6,320,748 B1 * | 11/2001 | Roden | ................... | H01L 23/367 165/185 |
| 6,339,256 B2 * | 1/2002 | Akram | .................... | H01L 23/52 257/680 |
| 7,002,803 B2 * | 2/2006 | Kurihara | ............... | H01L 21/565 165/185 |
| 7,289,329 B2 * | 10/2007 | Chen | ................... | H01F 27/2804 165/185 |
| 7,952,879 B1 * | 5/2011 | Vinciarelli | ............. | H05K 7/209 165/185 |
| 8,169,779 B2 * | 5/2012 | Le | ....................... | H01L 23/4735 165/104.33 |
| 2003/0133267 A1 * | 7/2003 | Beihoff | ................... | B60L 11/12 361/704 |

(Continued)

*Primary Examiner* — Anthony Haughton
*Assistant Examiner* — Razmeen Gafur
(74) *Attorney, Agent, or Firm* — Andy M. Han

(57) ABSTRACT

Embodiments of a mechanism of thermal isolation for multiple heat-generating devices on a substrate are described. In one aspect, a substrate is configured for a plurality of heat-generating devices to be disposed thereon. The substrate comprises an electrically-conductive layer that is electrically coupled to the heat-generating devices when the heat-generating devices are disposed on the substrate. The electrically-conductive layer is configured to thermally isolate the heat-generating devices such that there is no thermal coupling through the electrically-conductive layer amongst the heat-generating devices.

19 Claims, 4 Drawing Sheets

(56) References Cited

U.S. PATENT DOCUMENTS

| | | | |
|---|---|---|---|
| 2003/0183922 A1* | 10/2003 | Enriquez | H01L 23/50 257/707 |
| 2004/0120120 A1* | 6/2004 | Soto | H05K 7/209 361/719 |
| 2004/0207077 A1* | 10/2004 | Leal | H01L 21/561 257/723 |
| 2005/0024838 A1* | 2/2005 | Maxwell | H01L 23/5385 361/782 |
| 2005/0270745 A1* | 12/2005 | Chen | H01F 27/2804 361/707 |
| 2007/0272435 A1* | 11/2007 | Johnson | H05K 1/0204 174/259 |
| 2008/0030956 A1* | 2/2008 | Silverstein | F28D 15/0266 361/700 |
| 2008/0239675 A1* | 10/2008 | Speier | H01L 23/13 361/712 |
| 2009/0185352 A1* | 7/2009 | Ellsworth | H05K 1/0204 361/720 |
| 2010/0039774 A1* | 2/2010 | Steger | H01L 23/053 361/709 |
| 2010/0091460 A1* | 4/2010 | Hinze | H01L 23/367 361/709 |
| 2010/0320588 A1* | 12/2010 | Dahilig | H01L 21/561 257/690 |
| 2011/0037165 A1* | 2/2011 | Oh | H01L 21/561 257/712 |
| 2011/0090631 A1* | 4/2011 | Atkinson | G06F 1/203 361/679.26 |
| 2011/0110048 A1* | 5/2011 | Lima | H05K 7/20418 361/720 |
| 2011/0141690 A1* | 6/2011 | Le | H01L 23/4735 361/689 |
| 2012/0201008 A1* | 8/2012 | Hershberger | H05K 1/0203 361/720 |

* cited by examiner

ISOLATION OF THERMAL GROUND FOR MULTIPLE HEAT-GENERATING DEVICES ON A SUBSTRATE

CROSS REFERENCE TO RELATED PATENT APPLICATION

This application claims the priority benefit and is a non-provisional of U.S. Patent Application No. 61/764,531, filed 13 Feb. 2013 and entitled "Isolation Of Thermal Ground For Multiple Heat-Generating Devices On A Substrate", which is herein incorporated by reference.

TECHNICAL FIELD

The present disclosure generally relates to the field of transfer of thermal energy and, more particularly, to isolation of thermal ground for multiple heat-generating devices that are in close proximity and disposed on the same substrate.

BACKGROUND

There are many applications, ranging from consumer electronics to telecommunications and the like, in which electrically-driven devices (e.g., semiconductor-based electronic devices) capable of performing various tasks are packed in close proximity in a small form factor to serve various needs. Such electrically-driven devices may include, for example, driver circuits, logic processors, graphics processors, memory chips, laser diodes including edge-emitting lasers and vertical-cavity surface-emitting lasers (VCSELs), light-emitting diodes (LEDs), photodiodes, sensors, etc. Many of such electrically-driven devices inevitably generate thermal energy, or heat, in operation and thus are heat sources during operation as well as for a period of time after power off. As the number and complexity of the functionalities performed by such electrically-driven devices continue to increase and as the distance between electrically-driven devices in the small form factor continues to decrease, heat generated by such electrically-driven devices, as heat sources, present technical challenges that need to be addressed.

For one thing, performance, useful lifespan, or both, of an electrically-driven device may be significantly impacted if the heat generated by the device is not adequately dissipated or otherwise removed from the device. Moreover, given the close proximity between two or more electrically-driven devices on the same substrate, e.g., printed circuit board (PCB), in some applications, a phenomenon of thermal coupling between the two or more devices in close proximity may occur and result in the heat generated by one of the devices being transferred to one or more adjacent devices. When thermal coupling occurs, at least a portion of the heat generated by a first electrically-driven devices is transferred to a second electrically-driven device in close proximity due to temperature gradient, such that the temperature of the second electrically-driven device rises to a point higher than it would be when no heat is transferred from the first electrically-driven device to the second electrically-driven device. More specifically, when thermal coupling occurs and when no adequate heat transfer mechanism exists, heat generated by electrically-driven devices in close proximity may detrimentally deteriorate the performance and useful lifespan of some or all of the affected devices. As electrically-driven devices generate heat, they are referred to as heat-generating devices hereinafter.

SUMMARY

Various embodiments disclosed herein pertain to a technique, design, scheme, device and mechanism for isolation of thermal ground for multiple heat-generating devices on a substrate.

According to one aspect, a device may comprise a substrate. The substrate may be configured for a plurality of heat-generating devices to be disposed thereon. The substrate may comprise an electrically-conductive layer that is electrically coupled to the heat-generating devices when the heat-generating devices are disposed on the substrate. The electrically-conductive layer may be configured to thermally isolate the heat-generating devices such that there is no thermal coupling through the electrically-conductive layer amongst the heat-generating devices.

In one embodiment, the electrically-conductive layer may comprise a plurality of electrically-conductive sheets physically separated from each other. Each of the electrically-conductive sheets may correspond to a respective one of the heat-generating devices.

In one embodiment, at least one of the electrically-conductive sheets may comprise a copper sheet.

In one embodiment, the substrate may further comprise an electrically-insulating layer adjacent the electrically-conductive layer.

In one embodiment, the electrically-insulating layer may comprise an FR4 layer.

In one embodiment, the electrically-insulating layer may comprise a plurality of via holes each of which corresponding to a respective one of the heat-generating devices.

In one embodiment, the substrate may further comprise a plurality of electrically-conductive vias each of which contained in a respective one of the via holes. Each of the electrically-conductive vias may be configured to be electrically coupled to a respective one of the heat-generating devices when the heat-generating devices are attached to the substrate.

In one embodiment, at least one of the electrically-conductive vias may comprise a copper via.

In one embodiment, the device may further comprise a heat sink corresponding to a first one of the heat-generating devices to conduct heat away from the first one of the heat-generating devices.

In one embodiment, the heat sink may be made of metal.

In one embodiment, the heat sink may comprise a container and a phase-change material enclosed in the container.

In one embodiment, the container may be made of silicon.

In one embodiment, the heat sink may be in physical contact with one of the electrically-conductive sheets that corresponds to the first one of the heat-generating devices.

In one embodiment, the device may further comprise a thermally-conductive plate that is configured to be in physical contact with at least one of the heat-generating devices.

In one embodiment, the thermally-conductive plate may be made of metal.

In one embodiment, the heat sink may be in physical contact with one or more of the heat-generating devices.

In one embodiment, the device may further comprise the heat-generating devices.

In one embodiment, at least one of the heat-generating devices may comprise an integrated circuit chip.

In one embodiment, the integrated circuit chip may comprise a processor chip, a memory chip, a graphics chip, an application-specific integrated circuit (ASIC) chip, a field programmable gate array (FPGA) chip, a laser diode, a vertical-cavity surface-emitting laser (VCSEL), or a light-emitting diode (LED).

In one embodiment, the substrate may comprise a printed circuit board (PCB).

According to another aspect, a device may include a number of heat-generating devices, a substrate, and a thermally-conductive plate. The heat-generating devices are disposed on the substrate. The substrate may include an electrically-conductive layer that is electrically coupled to the heat-generating devices. The electrically-conductive layer may be configured to thermally isolate the heat-generating devices such that there is no thermal coupling through the electrically-conductive layer amongst the heat-generating devices. The electrically-conductive layer may include a number of electrically-conductive sheets physically separated from each other. Each of the electrically-conductive sheets may correspond to a respective one of the heat-generating devices. The substrate may further include an electrically-insulating layer adjacent the electrically-conductive layer. The thermally-conductive plate may be configured to be in physical contact with at least one of the heat-generating devices when the at least one of the heat-generating devices is sandwiched between the thermally-conductive plate and the substrate.

The proposed techniques are further described below in the detailed description. This summary is not intended to identify essential features of the claimed subject matter, nor is it intended for use in determining the scope of the claimed subject matter.

BRIEF DESCRIPTION OF THE DRAWINGS

The accompanying drawings are included to provide a further understanding of the disclosure, and are incorporated in and constitute a part of the present disclosure. The drawings illustrate embodiments of the disclosure and, together with the description, serve to explain the principles of the disclosure. It is appreciable that the drawings are not necessarily in scale as some components may be shown to be out of proportion than the size in actual implementation in order to clearly illustrate the concept of the present disclosure.

DETAILED DESCRIPTION OF PREFERRED EMBODIMENTS

Overview

Common practice nowadays utilizes a single copper layer in a PCB that serves as a common thermal ground for multiple heat-generating devices (e.g., processor chip and/or memory chips, etc.) that are surface-mounted on the PCB. However, such an arrangement tends to result in thermal coupling amongst the multiple heat-generating devices. For example, at least part of the heat generated by the device that generates most of the heat (e.g., having the highest temperature during operation) may be conducted to one or more of the other heat-generating devices through the copper layer. This would negatively impact the one or more affected devices as heat would not be conducted away from the one or more affected devices as effectively as would be when there is no thermal coupling.

Contrary to the common practice, the proposed scheme, mechanism and device thermally de-couples or isolates the multiple heat-generating devices from each other so that there is no thermal coupling amongst the multiple heat-generating devices, at least not by conduction through the copper layer. According to the present disclosure, the copper layer (or any suitable electrically-conductive layer in place of the copper layer) is separated into multiple sheets with a gap between and separating every two adjacent sheets. This way, heat generated by a given heat-generating device is not and cannot be conducted to one or more other heat-generating devices on the PCB through the copper layer. In other words, thermal grounds for the multiple heat-generating devices are isolated from each other. Moreover, one or more heat sinks may be utilized to aid heat dissipation from one or more of the multiple heat-generating devices.

Illustrative Implementations

Figure 1:
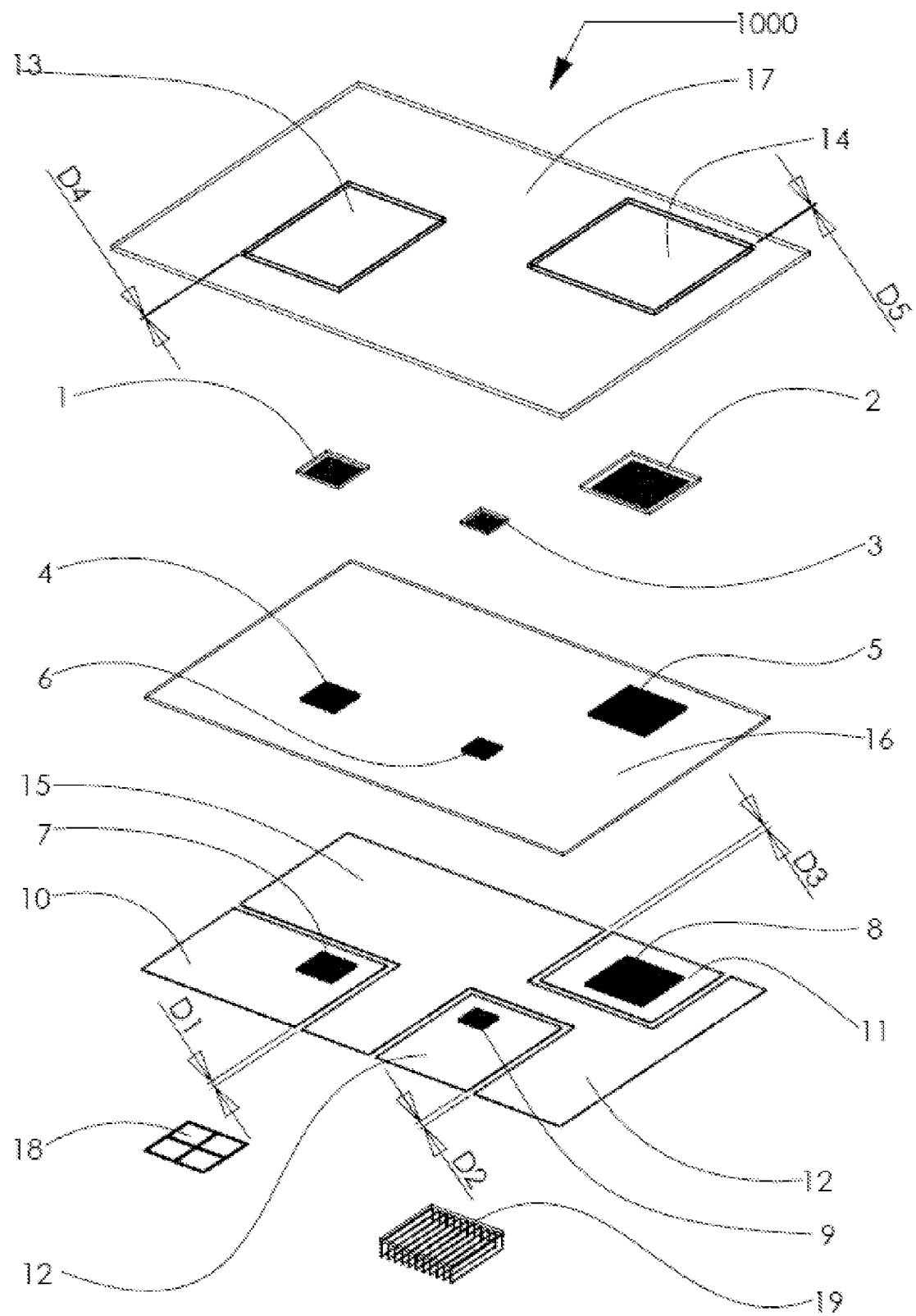
FIG. 1 is an exploded view of elements of a thermal isolation device in accordance with an embodiment of the present disclosure.
Figure 2:
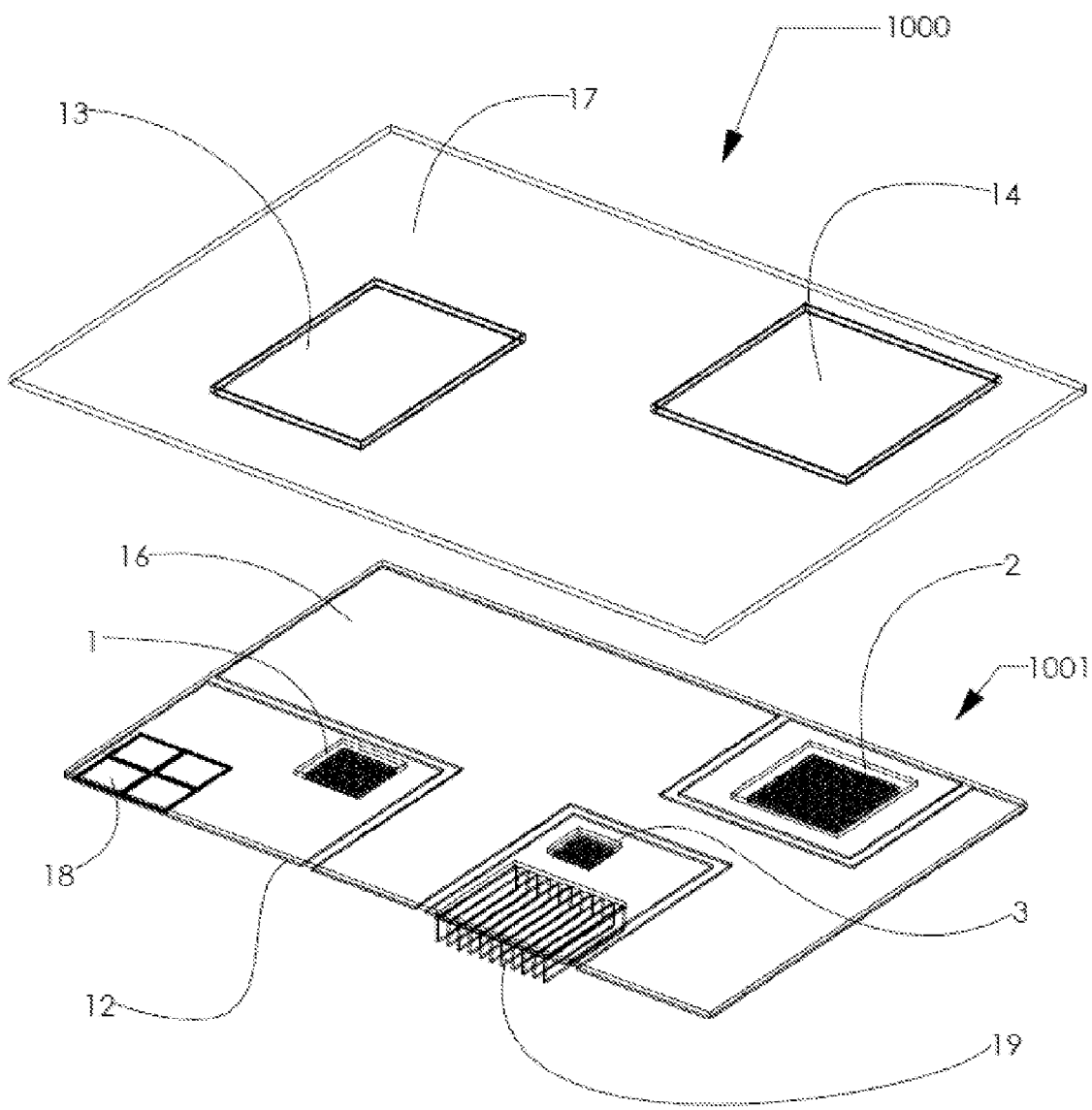
FIG. 2 is a perspective view of partially assembled elements of the thermal isolation device of FIG. 1.
Figure 3:
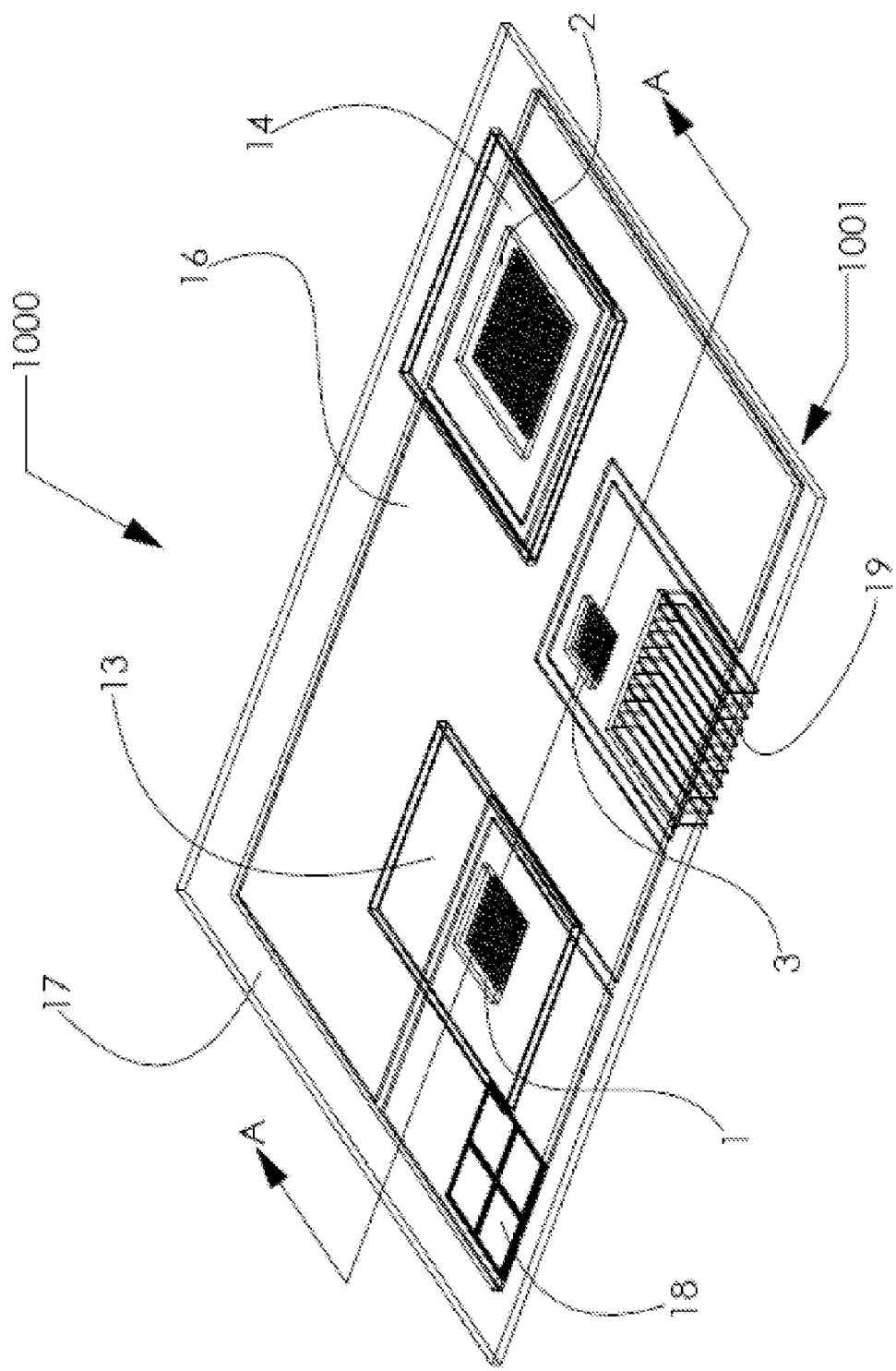
FIG. 3 is a perspective view of fully assembled elements of the thermal isolation device of FIG. 1.
Figure 4:
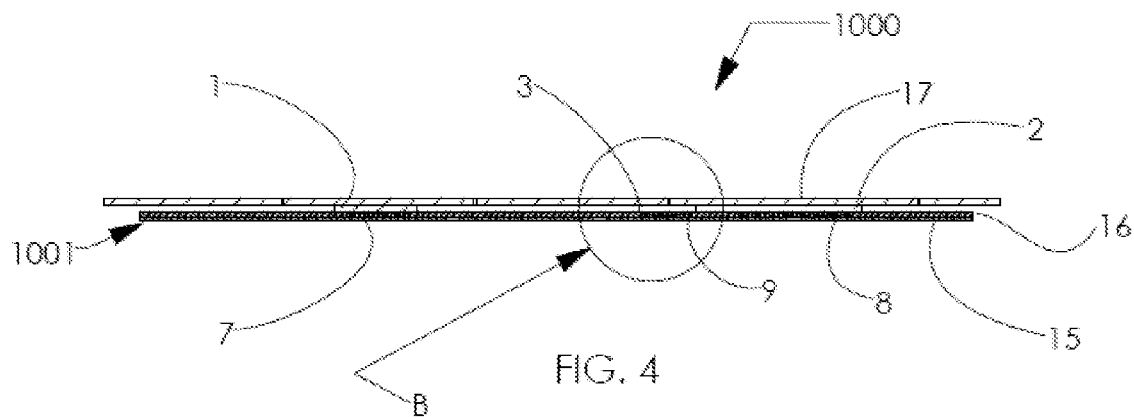
FIG. 4 is a side view of the thermal isolation device of FIG. 3.
Figure 5:
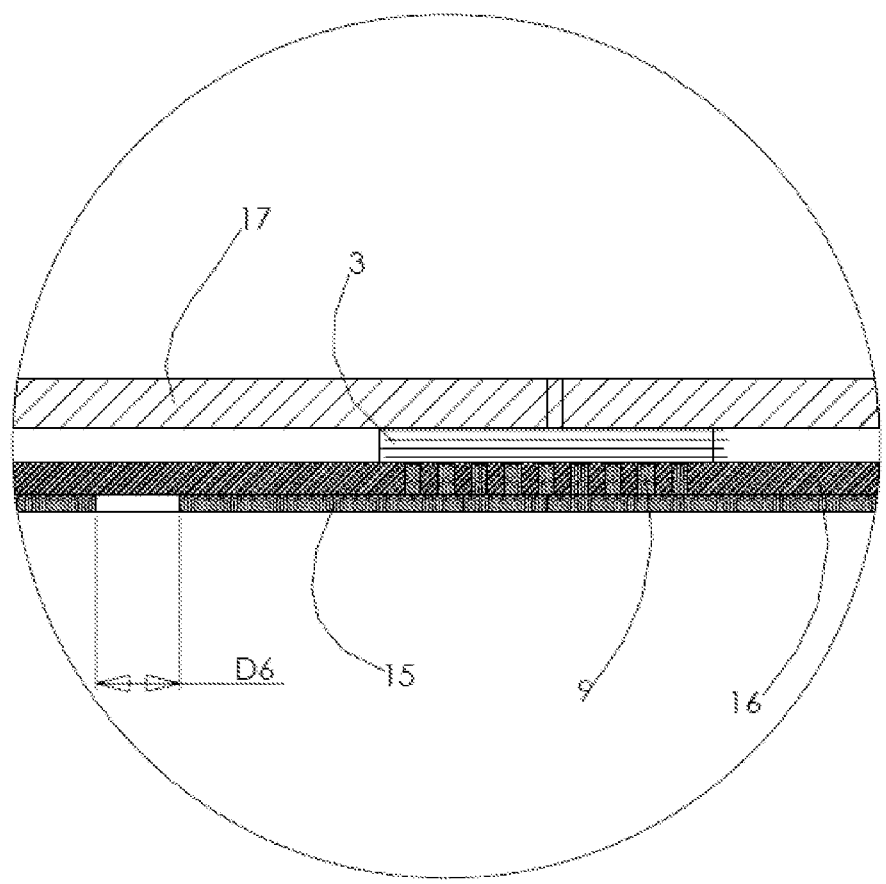
FIG. 5 is an enlarged view of a section of the thermal isolation device of FIG. 4.

FIG. 1 illustrates a thermal isolation device 1000 in accordance with an embodiment of the present disclosure. FIG. 2 illustrates partially assembled elements of the thermal isolation device 1000 of FIG. 1. FIG. 3 illustrates fully assembled elements of the thermal isolation device 1000 of FIG. 1. FIG. 4 is a side view of the thermal isolation device 1000 of FIG. 3. FIG. 5 is an enlarged view of a section of the thermal isolation device 1000 of FIG. 4. The description below is provided in reference to FIGS. 1-5.

As shown in FIGS. 1-5, device 1000 may comprise a substrate 1001. The substrate 1001 may be configured for a number of heat-generating devices 1, 2, 3 to be disposed or otherwise mounted or attached thereon. It would be appreciated by those skilled in the art that, although three heat-generating devices are shown in FIGS. 1-5, in actual implementations the number of heat-generating devices may vary (e.g., two, four, five, six, or more). That is, the scope of the present disclosure is not limited to what is shown in the figures.

The substrate 1001 may include an electrically-conductive layer that is electrically coupled to the heat-generating devices 1, 2, 3 when the heat-generating devices 1, 2, 3 are disposed on the substrate 1001. The electrically-conductive layer may be configured to thermally isolate the heat-generating devices 1, 2, 3 such that there is no thermal coupling through the electrically-conductive layer amongst the heat-generating devices 1, 2, 3.

In one embodiment, the electrically-conductive layer may include a number of electrically-conductive sheets 10, 11, 12, 15, on the same plane or layer, that are physically separated from each other. Each of the electrically-conductive sheets 10, 11, 12, 15 may or may not correspond to a respective one of the heat-generating devices 1, 2, 3. In the illustrated example, electrically-conductive sheet 10 corresponds to heat-generating device 1, electrically-conductive sheet 11 corresponds to heat-generating device 2, and electrically-conductive sheet 12 corresponds to heat-generating device 3.

A gap, or spacing, exists between every two adjacent sheets of the electrically-conductive sheets 10, 11, 12, 15 to ensure there is no physical contact (and hence no thermal or electrical coupling) between the electrically-conductive sheets 10, 11, 12, 15. For example, gap D1 is provided between the electrically-conductive sheet 10 and the electrically-conductive sheet 15. Gap D2 is provided between the electrically-conductive sheet 12 and the electrically-conductive sheet 15. Gap D3 is provided between the electrically-conductive sheet 11 and the electrically-conductive sheet 15. Dimensions of gaps D1, D2 and D3 may be substantially the same or different. As shown in FIG. 5, a gap D6 exists between the electrically-conductive sheet 15 and a neighboring electrically-conductive sheet (e.g., electrically-conductive sheet 10, 11 or 12).

In one embodiment, at least one of the electrically-conductive sheets 10, 11, 12, 15 may be a copper sheet.

In one embodiment, the substrate 1001 may further include an electrically-insulating layer 16 adjacent (e.g., above or below) the electrically-conductive layer.

In one embodiment, the electrically-insulating layer 16 may include an FR4 layer. FR4, or FR-4, is a grade designation assigned to glass-reinforced epoxy laminate sheets, tubes, rods and PCBs. An FR4 layer is a layer made of composite material composed of, for example, woven fiberglass cloth with an epoxy resin binder that is flame resistant.

In one embodiment, the electrically-insulating layer 16 may include a number of via holes 4, 5, 6. Each of via holes 4, 5, 6 corresponds to a respective one of the heat-generating devices 1, 2, 3.

In one embodiment, the substrate 1001 may further include a number of electrically-conductive vias 7, 8, 9. Each of the electrically-conductive vias 7, 8, 9 is contained in a respective one of the via holes 4, 5, 6. Each of the electrically-conductive vias 7, 8, 9 may be configured to be electrically coupled to a respective one of the heat-generating devices 1, 2, 3 when the heat-generating devices 1, 2, 3 are disposed on the substrate 1001 so that each of the heat-generating devices 1, 2, 3 may be electrically powered by an external power source through the electrically-conductive vias 7, 8, 9.

In one embodiment, at least one of the electrically-conductive vias 7, 8, 9 may be a copper via. That is, one, some or all of the electrically-conductive vias 7, 8, 9 may be made of metal such as copper.

In one embodiment, the device 1000 may further include at least one heat sink corresponding to at least one of the heat-generating devices 1, 2, 3 to conduct heat away from the at least one of the heat-generating devices 1, 2, 3. For example, as shown in FIGS. 1-5 for illustrative purpose and not limiting the scope of the present disclosure, the device 1000 includes two heat sinks—first heat sink 18 and second heat sink 19. The first heat sink 18 corresponds to heat-generating device 1 while the second heat sink 19 corresponds to heat-generating device 3. That is, the first heat sink 18 functions to transfer heat away from heat-generating device 1 by conduction while the second heat sink 19 functions to transfer heat away from heat-generating device 3 by conduction. In other embodiments, fewer or more heat sinks may be utilized.

In one embodiment, one of the at least one heat sink may be made of metal, ceramic, silicon, or a combination thereof. For example, the heat sink 19 is made of metal such as copper. As shown in FIGS. 1-3, heat sink 19 may include a number of protrusions that may be flared fins, straight fins, pins, or any shape that increase the surface area of the heat sink 19 to better facilitate thermal convection and radiation to dissipate heat from heat sink 19 to the ambience.

In one embodiment, one of the at least one heat sink may include a container and a phase-change material enclosed or otherwise contained in the container. For example, the heat sink 18 includes a container with a phase-change material contained therein. The phase-change material is capable of storing and releasing large amounts of thermal energy. Heat is absorbed or released when the phase-change material changes from solid to liquid and vice versa. The phase-change material may be, for example, organic (e.g., paraffin or fatty acid), inorganic (e.g., salt hydrate), eutectic (e.g., an organic-organic compound, an organic-inorganic compound or an inorganic-inorganic compound), or a hygroscopic material.

In one embodiment, the container of the heat sink 18 may be made of silicon, metal, ceramic, or a combination thereof.

In one embodiment, the heat sink may be in physical contact with one of the electrically-conductive sheets 10, 11, 12, 15 that corresponds to the one of the heat-generating devices 1, 2, 3. For example, the heat sink 18 is in physical contact with the electrically-conductive sheet 10, and the heat sink 19 is in physical contact with the electrically-conductive sheet 12.

In one embodiment, the device 1000 may further include a thermally-conductive plate 17 that is configured to be in physical contact with at least one of the heat-generating devices 1, 2, 3. The thermally-conductive plate 17 may include one or more protrusions 13, 14 corresponding to one or more of the heat-generating devices 1, 2, 3. That is, the thermally-conductive plate 17 may have a respective recess on the side opposite to each of the one or more protrusions 13, 14 to accommodate and receive the corresponding heat-generating device. In the example shown, the protrusion 13 has a height of D4, and the protrusion 14 has a height of D5. Heights D4 and D5 may be substantially the same or different.

In one embodiment, the thermally-conductive plate 17 may be made of metal, ceramic or silicon. For example, the thermally-conductive plate 17 may be made of aluminum or copper.

In one embodiment, the at least one heat sink may be in physical contact with one of the heat-generating devices. For example, the heat sink 18 or 19 may be in direct contact with one of the heat-generating devices 1, 2, 3.

In one embodiment, the device 1000 may further include the heat-generating devices 1, 2, 3.

In one embodiment, at least one of the heat-generating devices 1, 2, 3 may include an integrated circuit chip.

In one embodiment, the integrated circuit chip may include a processor chip, a memory chip, a graphics chip, an application-specific integrated circuit (ASIC) chip, a field programmable gate array (FPGA) chip, a laser diode, a vertical-cavity surface-emitting laser (VCSEL), or a light-emitting diode (LED).

In one embodiment, the substrate 1001 may be a printed circuit board (PCB).

Additional and Alternative Implementation Notes

The above-described embodiments pertain to a technique, design, scheme, device and mechanism for isolation of thermal ground for multiple heat-generating devices on a substrate. Although the embodiments have been described in language specific to certain applications, it is to be understood that the appended claims are not necessarily limited to the specific features or applications described herein. Rather, the specific features and applications are disclosed as example forms of implementing such techniques.

In the above description of example implementations, for purposes of explanation, specific numbers, materials configurations, and other details are set forth in order to better explain the invention, as claimed. However, it will be apparent to one skilled in the art that the claimed invention may be practiced using different details than the example ones described herein. In other instances, well-known features are omitted or simplified to clarify the description of the example implementations.

The described embodiments are intended to be primarily examples. The described embodiments are not meant to limit the scope of the appended claims. Rather, the claimed invention might also be embodied and implemented in other ways, in conjunction with other present or future technologies.

Moreover, the word "example" is used herein to mean serving as an example, instance, or illustration. Any aspect or design described herein as "example" is not necessarily to be construed as preferred or advantageous over other aspects or designs. Rather, use of the word example is intended to present concepts and techniques in a concrete fashion. The term "techniques," for instance, may refer to one or more devices, apparatuses, systems, methods, articles of manufacture, and/or computer-readable instructions as indicated by the context described herein.

As used in this application, the term "or" is intended to mean an inclusive "or" rather than an exclusive "or." That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more," unless specified otherwise or clear from context to be directed to a singular form.

What is claimed is:

1. A device, comprising:
   a substrate configured for a plurality of heat-generating devices to be disposed thereon, the substrate comprising an electrically-conductive layer that is electrically coupled to the heat-generating devices when the heat-generating devices are disposed on the substrate, the electrically-conductive layer configured to thermally isolate the heat-generating devices such that there is no thermal coupling through the electrically-conductive layer amongst the heat-generating devices,
   wherein the electrically-conductive layer comprises a plurality of electrically-conductive sheets physically separated from each other, each of the electrically-conductive sheets corresponding to a respective one of the heat-generating devices.

2. The device of claim 1, wherein at least one of the electrically-conductive sheets comprises a copper sheet.

3. The device of claim 1, wherein the substrate further comprises an electrically-insulating layer adjacent the electrically-conductive layer.

4. The device of claim 3, wherein the electrically-insulating layer comprises an FR4 layer.

5. The device of claim 3, wherein the electrically-insulating layer comprises a plurality of via holes each of which corresponding to a respective one of the heat-generating devices.

6. The device of claim 5, wherein the substrate further comprises a plurality of electrically-conductive vias each of which contained in a respective one of the via holes, each of the electrically-conductive vias configured to be electrically coupled to a respective one of the heat-generating devices when the heat-generating devices are attached to the substrate.

7. The device of claim 6, wherein at least one of the electrically-conductive vias comprises a copper via.

8. The device of claim 1, further comprising:
   a heat sink corresponding to a first one of the heat-generating devices to conduct heat away from the first one of the heat-generating devices.

9. The device of claim 8, wherein the heat sink is made of metal, ceramic, silicon, or a combination thereof.

10. The device of claim 8, wherein the heat sink comprises:
    a container; and
    a phase-change material enclosed in the container.

11. The device of claim 10, wherein the container is made of silicon.

12. The device of claim 8, wherein the heat sink is in physical contact with one of the electrically-conductive sheets that corresponds to the first one of the heat-generating devices.

13. The device of claim 12, further comprising:
    a thermally-conductive plate configured to be in physical contact with at least one of the heat-generating devices.

14. The device of claim 13, wherein the thermally-conductive plate is made of metal.

15. The device of claim 1, further comprising:
    the heat-generating devices.

16. The device of claim 15, wherein at least one of the heat-generating devices comprises an integrated circuit chip.

17. The device of claim 16, wherein the integrated circuit chip comprises a processor chip, a memory chip, a graphics chip, an application-specific integrated circuit (ASIC) chip, a field programmable gate array (FPGA) chip, a laser diode, a vertical-cavity surface-emitting laser (VCSEL), or a light-emitting diode (LED).

18. The device of claim 1, wherein the substrate comprises a printed circuit board (PCB).

19. An device, comprising:
    a plurality of heat-generating devices;
    a substrate on which the heat-generating devices are disposed, the substrate comprising an electrically-conductive layer that is electrically coupled to the heat-generating devices, the electrically-conductive layer configured to thermally isolate the heat-generating devices such that there is no thermal coupling through the electrically-conductive layer amongst the heat-generating devices, the electrically-conductive layer comprising a plurality of electrically-conductive sheets physically separated from each other, each of the electrically-conductive sheets corresponding to a respective one of the heat-generating devices, the substrate further comprising an electrically-insulating layer adjacent the electrically-conductive layer; and
    a thermally-conductive plate configured to be in physical contact with at least one of the heat-generating devices when the at least one of the heat-generating devices is sandwiched between the thermally-conductive plate and the substrate.

* * * * *